(12) United States Patent
Suh et al.

(10) Patent No.: US 7,851,825 B2
(45) Date of Patent: Dec. 14, 2010

(54) INSULATED GATE E-MODE TRANSISTORS

(75) Inventors: Chang Soo Suh, Goleta, CA (US); Ilan Ben-Yaacov, Goleta, CA (US); Robert Coffie, Camarillo, CA (US); Umesh Mishra, Montecito, CA (US)

(73) Assignee: Transphorm Inc., Goleta, CA (US)

( * ) Notice: Subject to any disclaimer, the term of this patent is extended or adjusted under 35 U.S.C. 154(b) by 80 days.

(21) Appl. No.: 12/324,574

(22) Filed: Nov. 26, 2008

(65) Prior Publication Data

US 2009/0146185 A1 Jun. 11, 2009

Related U.S. Application Data

(60) Provisional application No. 61/012,755, filed on Dec. 10, 2007.

(51) Int. Cl.
*H01L 27/088* (2006.01)
*H01L 29/06* (2006.01)

(52) U.S. Cl. .......... 257/194; 257/201; 257/E27.061; 257/E29.194; 257/E21.409; 438/285

(58) Field of Classification Search .......... 257/194, 257/201, E21.403, E21.112, E29.081, E27.061, 257/E21.088, E29.246, E29.194, E21.409; 438/478, 285, 483, 455
See application file for complete search history.

(56) References Cited

U.S. PATENT DOCUMENTS 7,268,375 B2  9/2007  Shur et al.

| 2006/0157729 | A1 | 7/2006 | Ueno et al. | |
|---|---|---|---|---|
| 2007/0158692 | A1 | 7/2007 | Nakayama et al. | |
| 2007/0205433 | A1 | 9/2007 | Parikh et al. | |
| 2008/0237640 | A1* | 10/2008 | Mishra et al. | 257/194 |
| 2009/0072272 | A1* | 3/2009 | Suh et al. | 257/194 |
| 2009/0085065 | A1* | 4/2009 | Mishra et al. | 257/194 |

OTHER PUBLICATIONS

Stacia Keller et al., "Method for Heteroepitaxial Growth of High-Quality N-Face GaN, InN, and AlN and their Alloys by Metal Organic Chemical Vapor Deposition", U.S. Appl. No. 60/866,035, filed Nov. 15, 2006, 30 pp.

Umesh Mishra et al., "N-Face High Electron Mobility Transistors with Lower Buffer Leakage and Low Parasitic Resistance", U.S. Appl. No. 60/908,914, filed Mar. 29, 2007, 20 pp.

Chang Soo Suh et al., "High Breakdown Enhancement Mode GaN-Based HEMTs With Integrated Slant Field Plate", U.S. Appl. No. 60/822,886, filed Aug. 18, 2006, 16 pp.

(Continued)

*Primary Examiner*—Sue Purvis
*Assistant Examiner*—Whitney Moore
(74) *Attorney, Agent, or Firm*—Fish & Richardson P.C.

(57) ABSTRACT

Enhancement-mode III-nitride transistors are described that have a large source to drain barrier in the off state, low off state leakage, and low channel resistance in the access regions are described. The devices can include a charge depleting layer under the gate and/or a charge enhancing layer outside of the gate region, that is, in the access region.

33 Claims, 14 Drawing Sheets

OTHER PUBLICATIONS

Chang Soo Suh et al., "III-Nitride Devices with Recessed Gates", U.S. Appl. No. 60/972,481, filed Sep. 14, 2007, 18 pp.

Umesh Mishra et al., "Growing N-polar III-nitride Structures", U.S. Appl. No. 60/972,467, filed Sep. 14, 2007, 7 pp.

Siddharth Rajan et al., "N-Polar Aluminum Gallium Nitride/Gallium Nitride Enhancement-Mode Field Effect Transistor", U.S. Appl. No. 11/523,286, filed Sep. 18, 2006, 24 pp.

Chang Soo Suh et al., "Enhancement Mode Gallium Nitride Power Devices", U.S. Appl. No. 11/856,687, filed Sep. 17, 2007, 58 pp.

Yuvaraj Dora et al., "$ZrO_2$ gate dielectrics produced by ultraviolet ozone oxidation for GaN and AlGaN/GaN transistors", Mar./Apr. 2006, J. Vac. Sci. Technol. B 24(2), pp. 575-581.

Xing Gu et al., "AlGaN/GaN MOS transistors using crystalline $ZrO_2$ as gate dielectric", 2007, Proceedings of SPIE, vol. 6473, 64730S, 8 pp.

S. Sugiura et al., "Enhancement-mode n-channel GaN MOSFETs fabricated on $p$-GaN using $HfO_2$ as gate oxide", Aug. 16, 2007, Electronics Letters, vol. 43 No. 17, 2 pp.

W. Wang et al., "Comparison of the effect of gate dielectric layer on 2DEG carrier concentration in strained AlGaN/GaN heterostructure", 2005, Mater. Res. Soc. Symp. Proc. vol. 831, 6 pp.

Ruonan Wang et al., "Enhancement-Mode $Si_3N_4$/AlGaN/GaN MISHFETs", Oct. 2006; IEEE Electron Device Letters, vol. 27, No. 10, pp. 793-795.

Y. Ando et al., "10-W/mm AlGaN-GaN HFET With a Field Modulating Plate", May 2003, IEEE Electron Device Letters, vol. 24, No. 5, pp. 289-291.

V. Kumar et al., "High transconductance enhancement-mode AlGaN/GaN HEMTs on SiC substrate", Nov. 27, 2003, Electronics Letters, vol. 39, No. 24, 2 pp.

Bruce M. Green et al., "The Effect of Surface Passivation on the Microwave Characteristics of Undoped AlGaN/GaN HEMT's", Jun. 2000, IEEE Electron Device Letters, vol. 21, No. 6, pp. 268-270.

Umesh K. Mishra et al., "AlGaN/GaN HEMTs—An Overview of Device Operation and Applications", Jun. 2002, Proceedings of the IEEE, vol. 90, No. 6, pp. 1022-1031.

Marco Fanciulli et al., "Structural and Electrical Properties of $HfO_2$ Films Grown by Atomic Layer Deposition on Si, Ge, GaAs and GaN", 2004, Mat. Res. Soc. Symp. Proc. vol. 786, pp. E6.14.1-E6.14.6.

Robert L. Coffie, Characterizing and Suppressing DC-to-RF Dispersion in AlGaN/GaN High Electron Mobility Transistors, 2003, PhD Thesis, University of California, Santa Barbara, 169 pp.

Shreepad Karmalkar et al., "Very high voltage AlGaN/GaN high electron mobility transistors using a field plate deposited on a stepped insulator", 2001, Solid-State Electronics, 45, pp. 1645-1652.

International Search Report and Written Opinion for Application No. PCT/US2008/085031, dated Jun. 24, 2009, 11 pages.

Authorized officer Yolaine Cussac, International Preliminary Report on Patentability for Application No. PCT/US2008/085031, mailed Jun. 24, 2010, 6 pages.

* cited by examiner

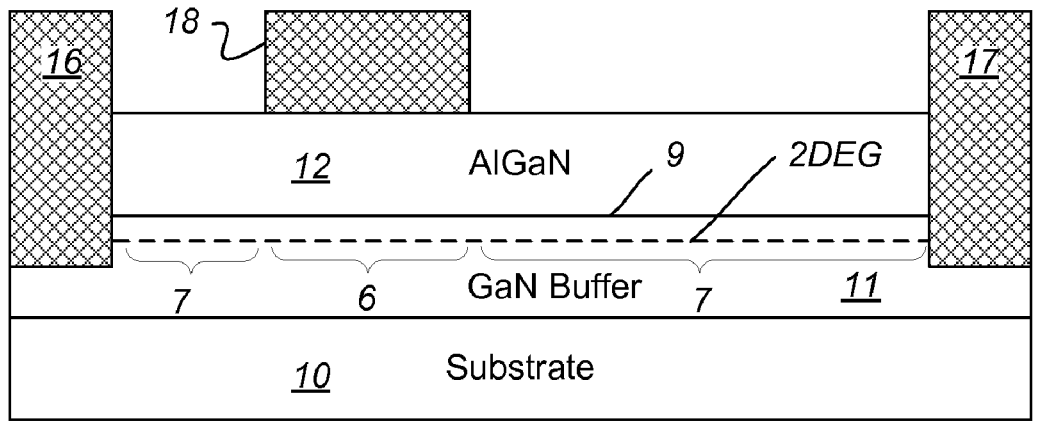
FIG._1
(prior art)
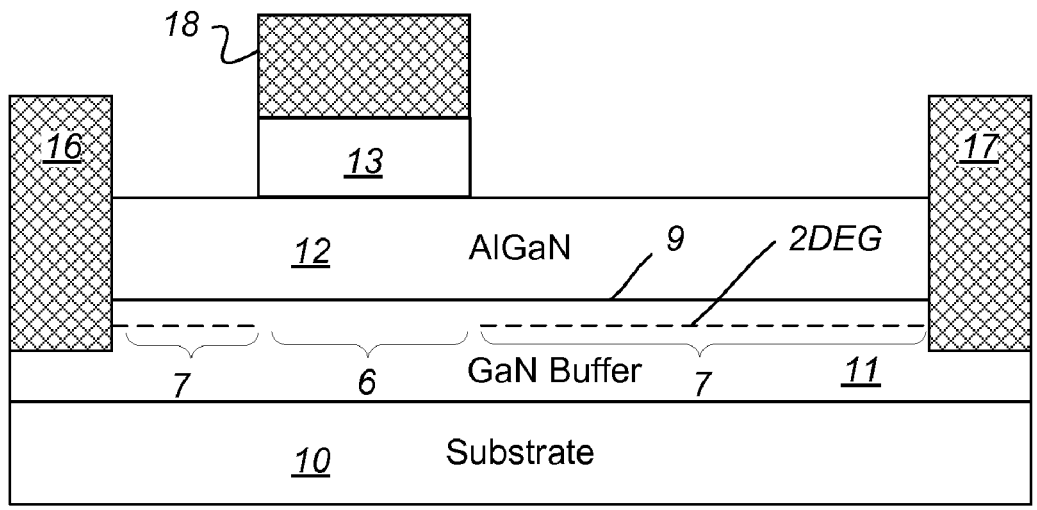
FIG._2a

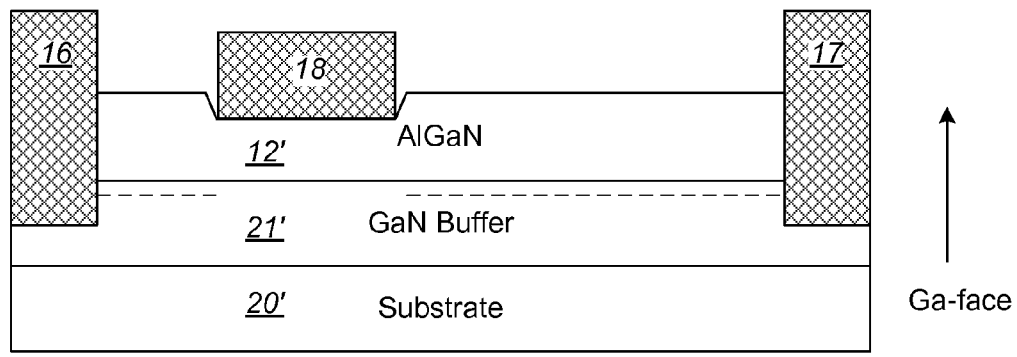
FIG._2b
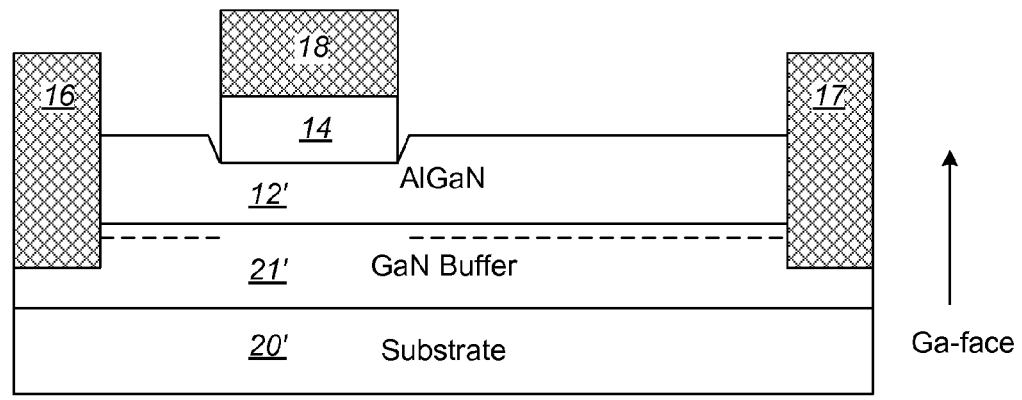
FIG._2c

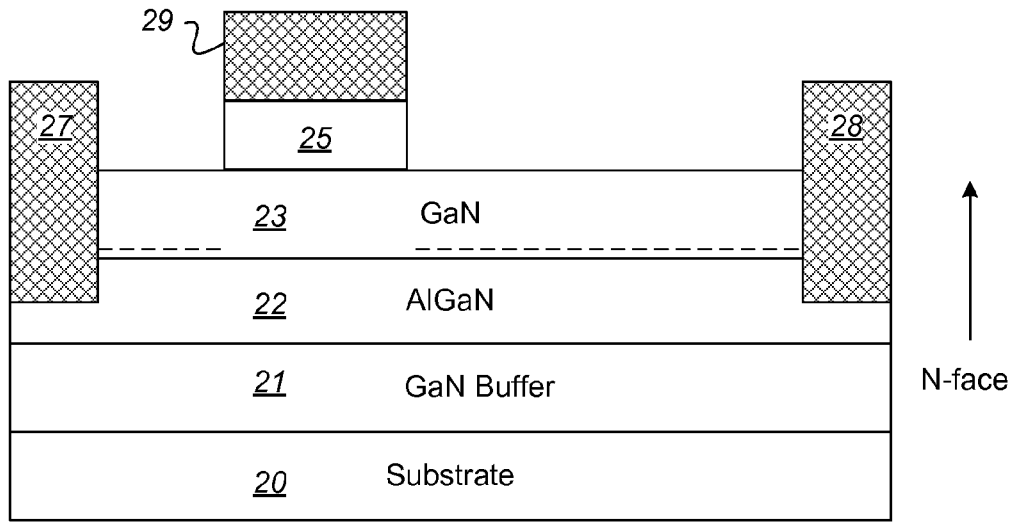
FIG._3
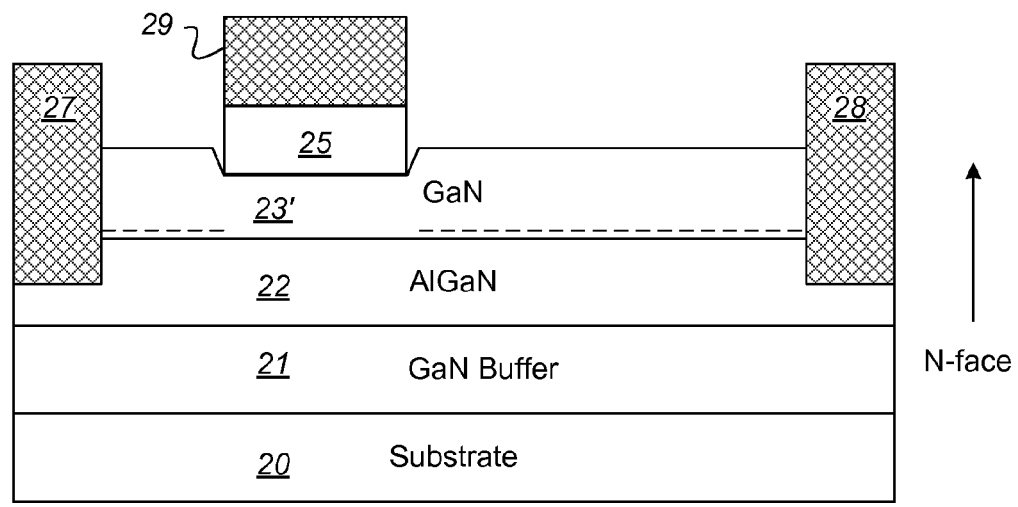
FIG._4

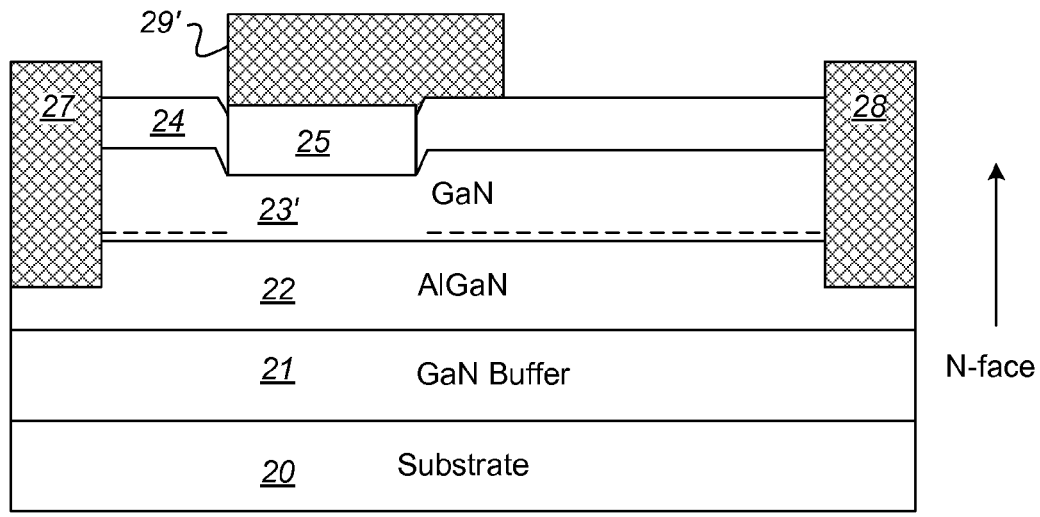
*FIG._5*
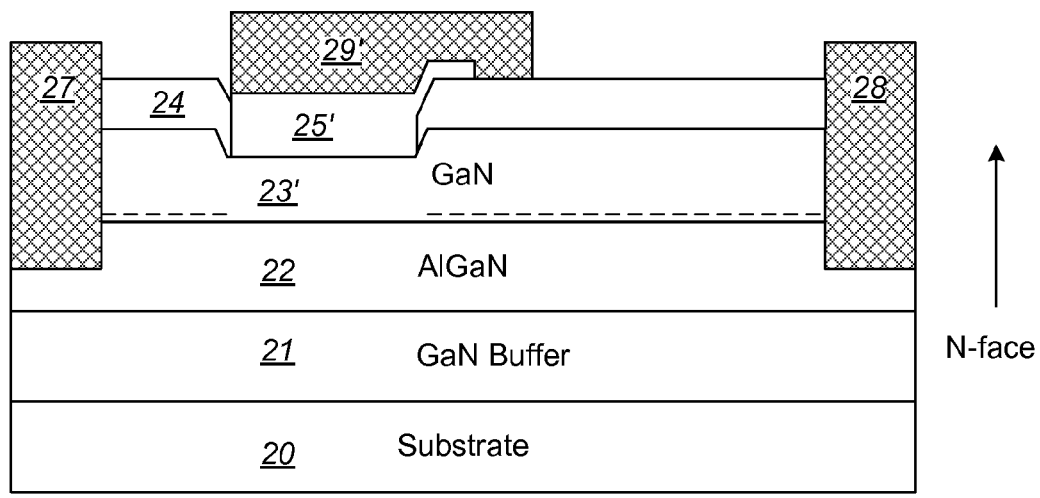
*FIG._6*

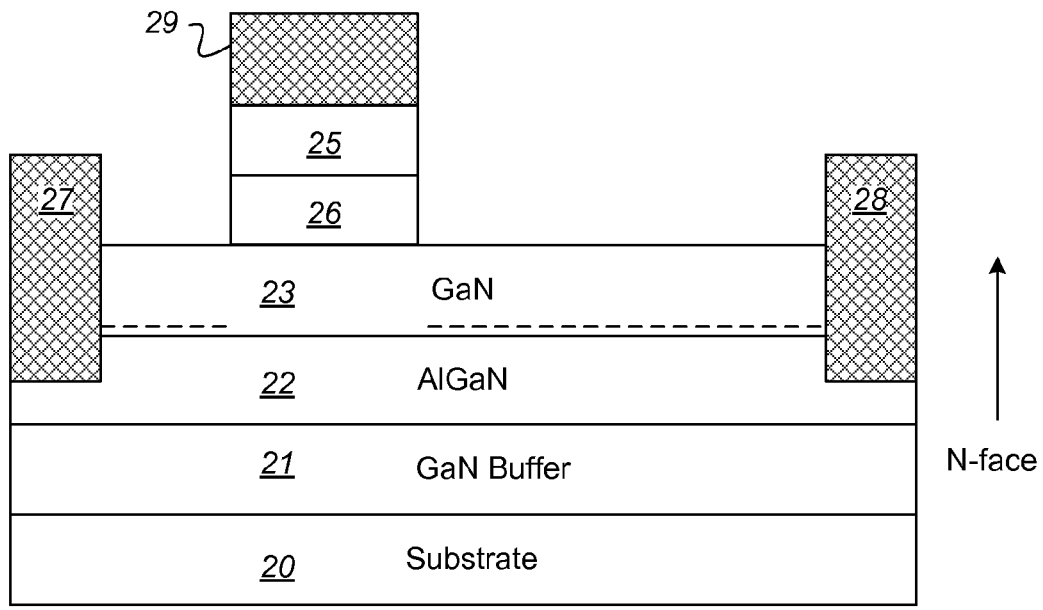
FIG._7
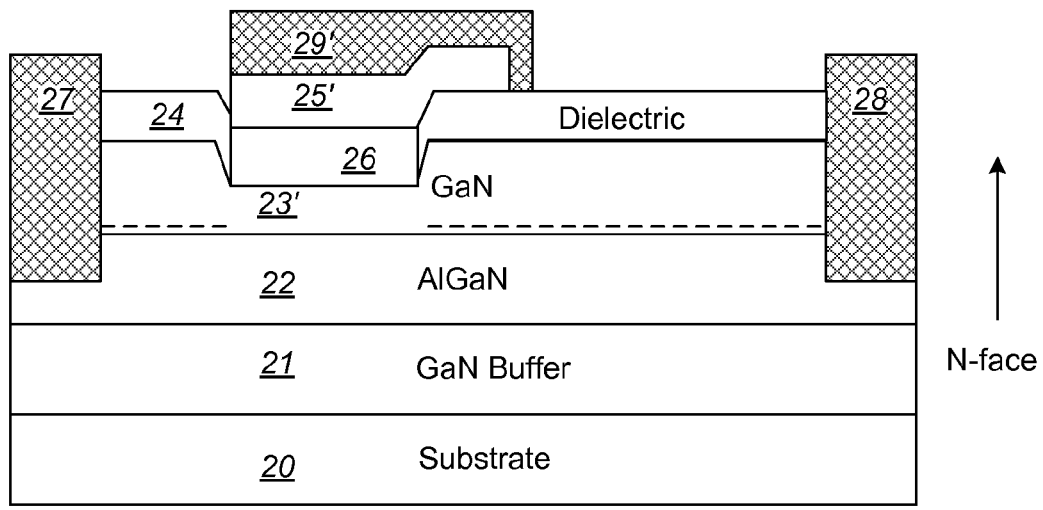
FIG._8

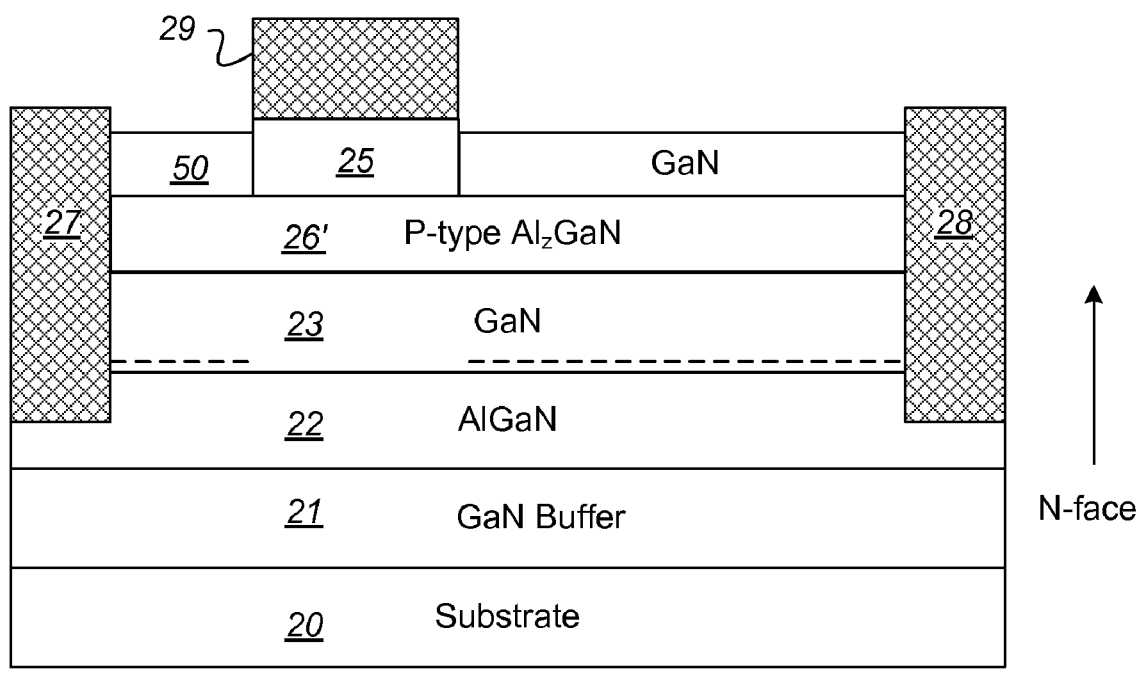
FIG._9

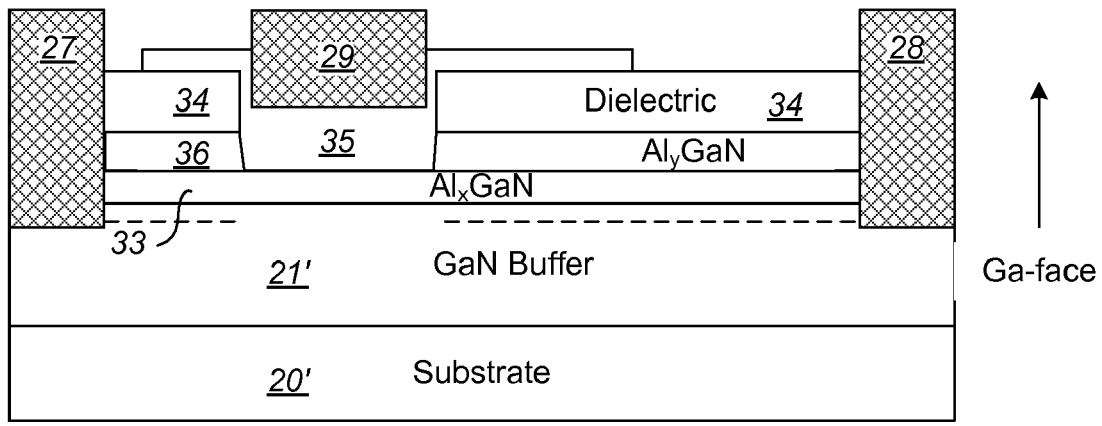
FIG._10
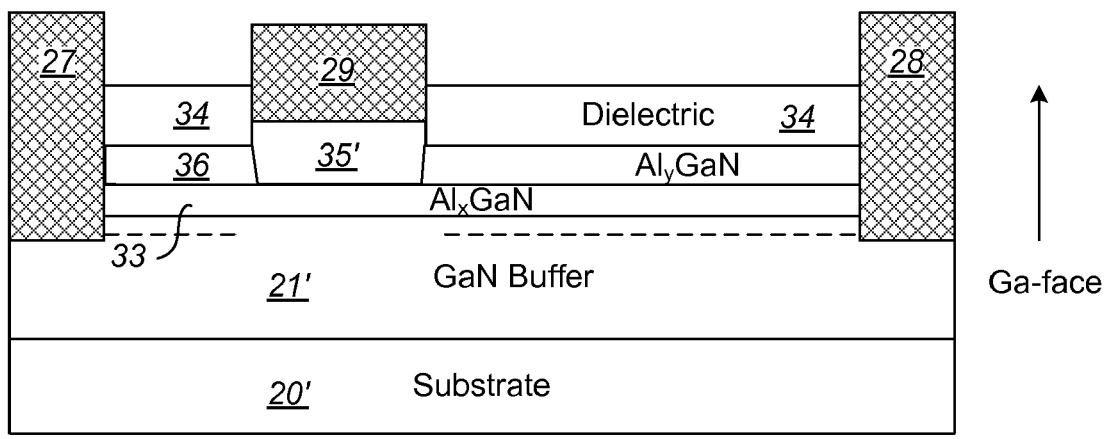
FIG._11

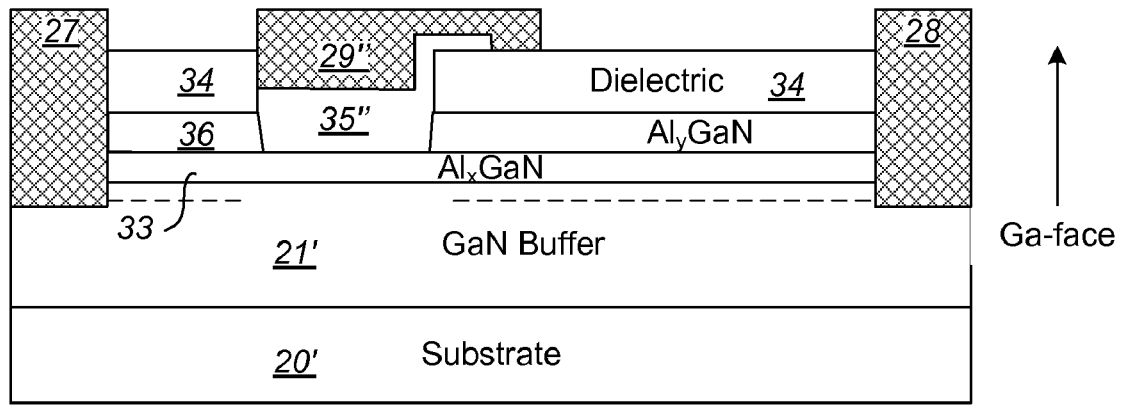
FIG._12
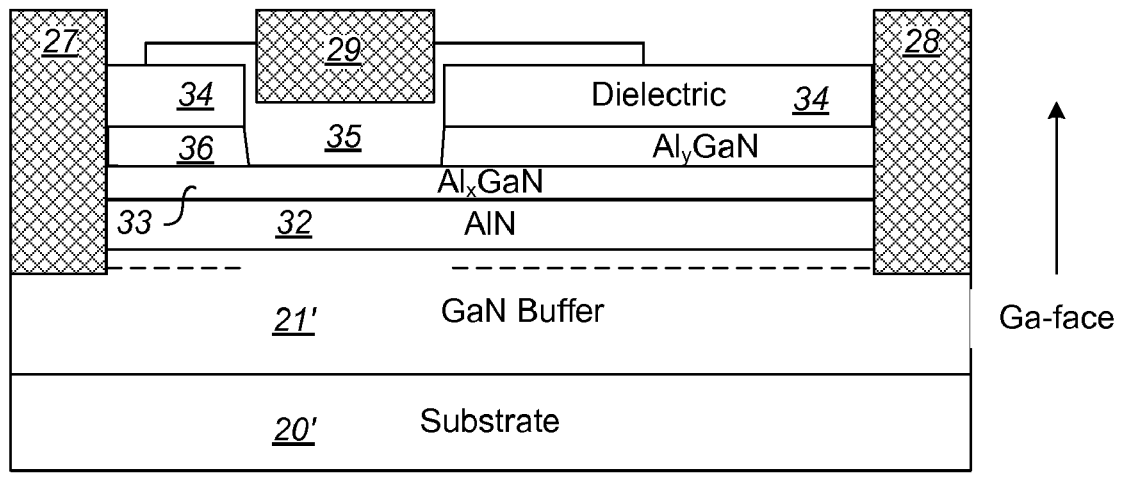
FIG._13

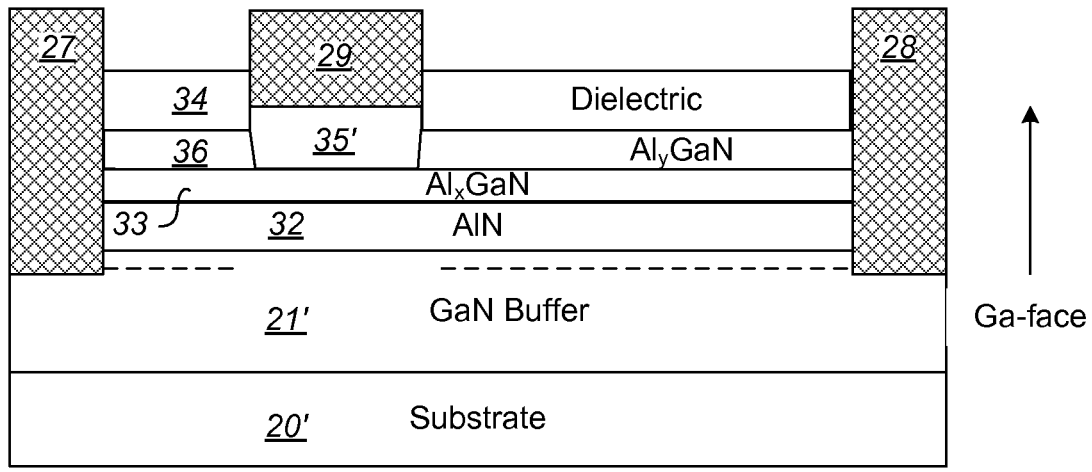
FIG._14
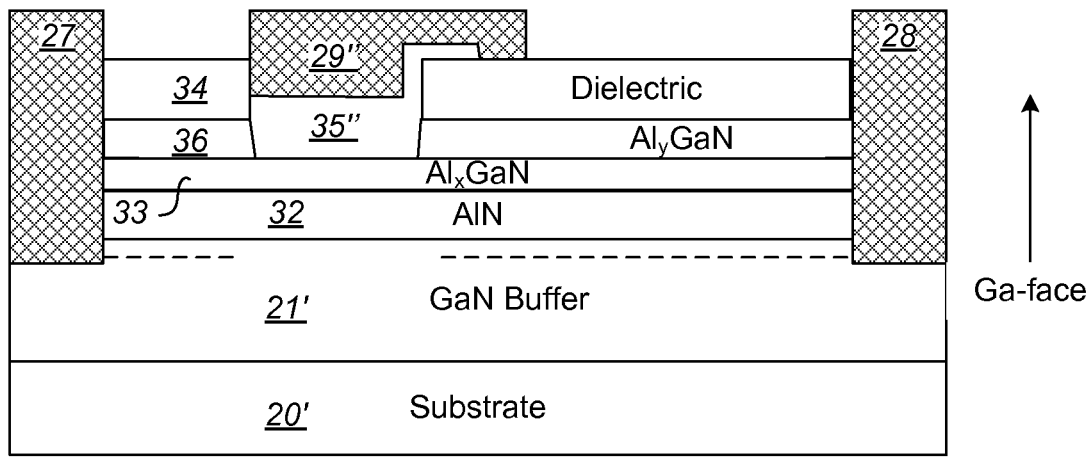
FIG._15

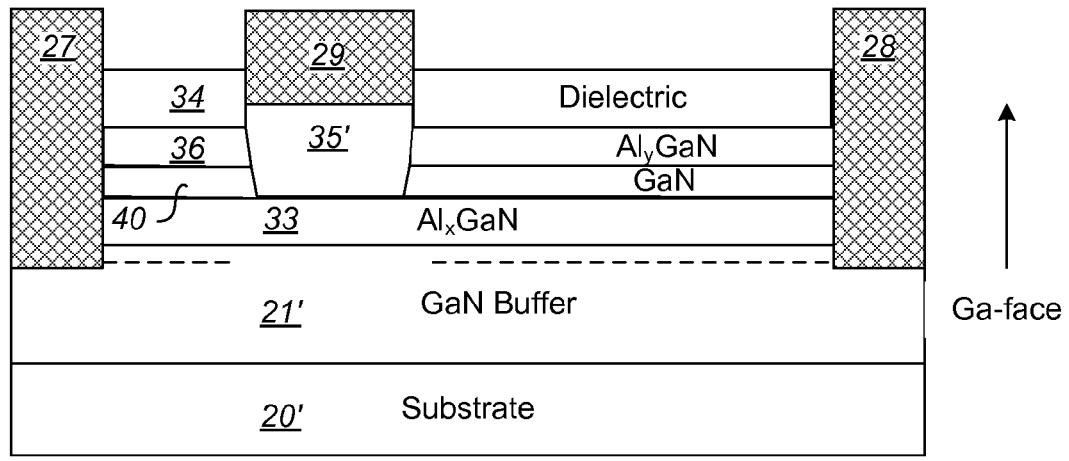
FIG._16
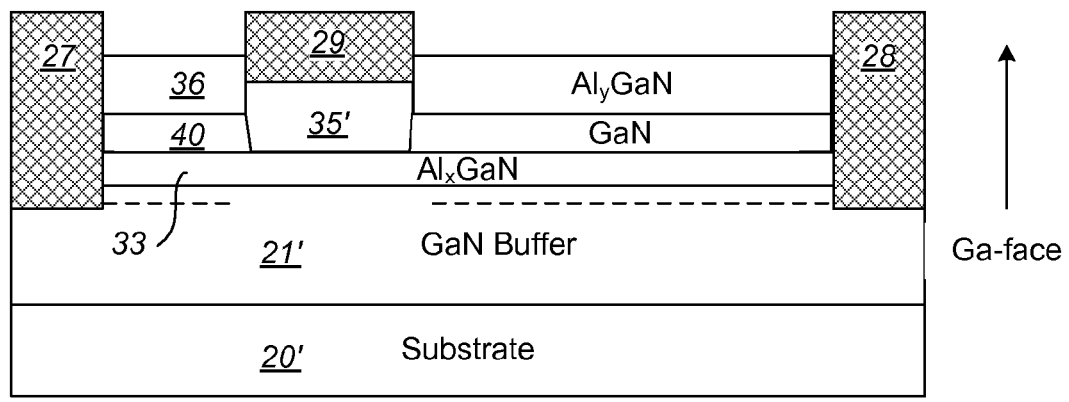
FIG._17

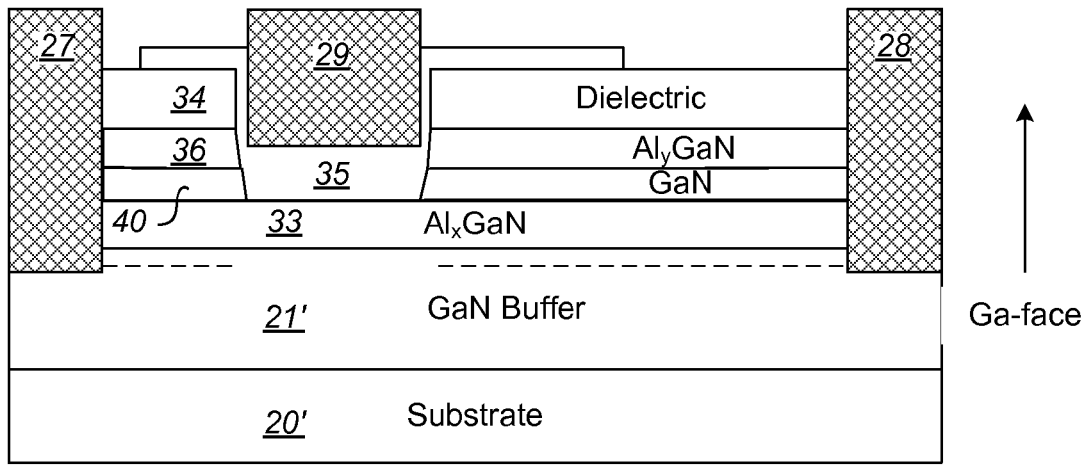
FIG._18
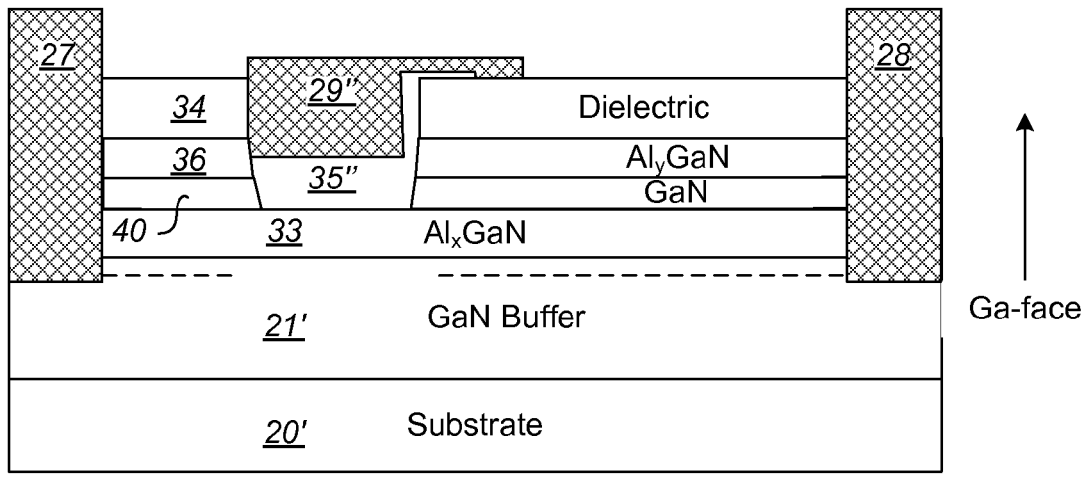
FIG._19

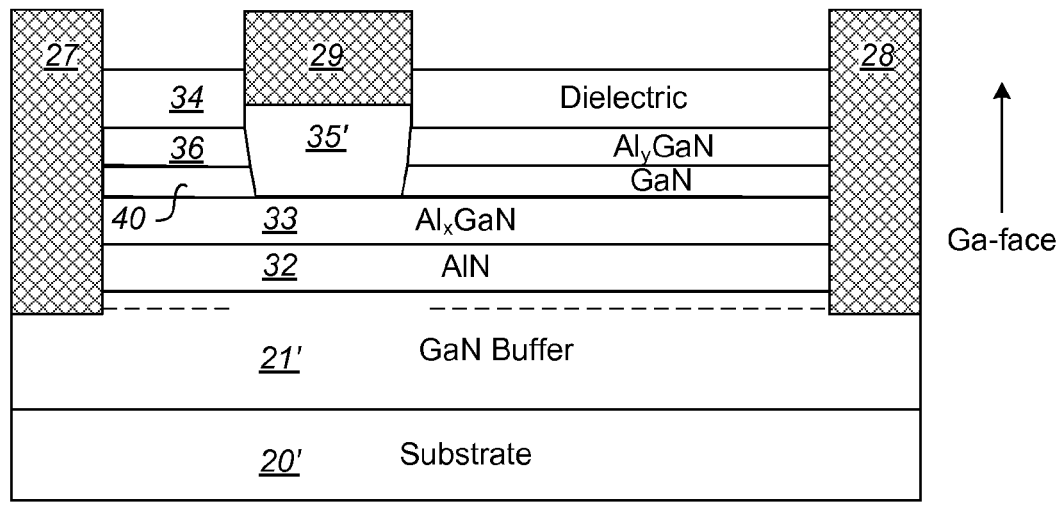
FIG._20
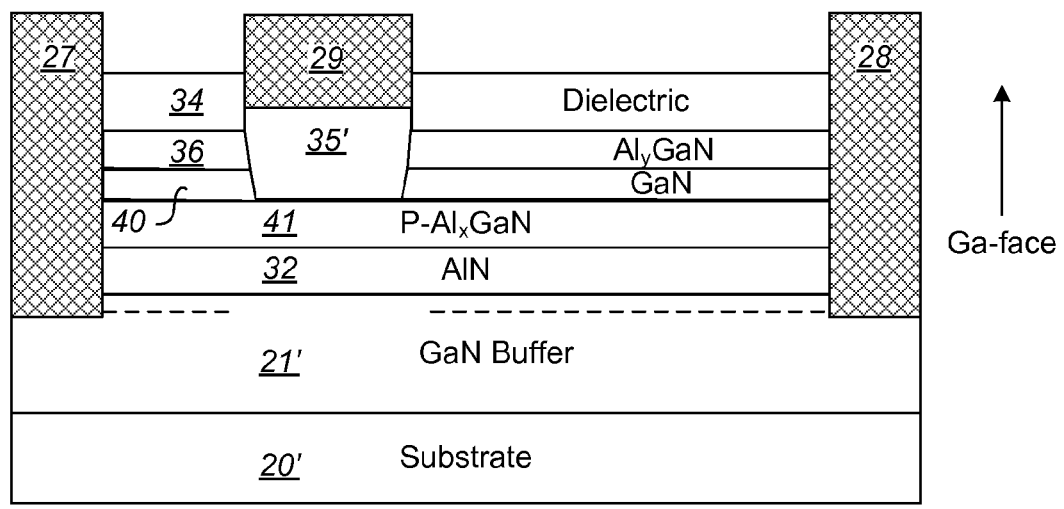
FIG._21

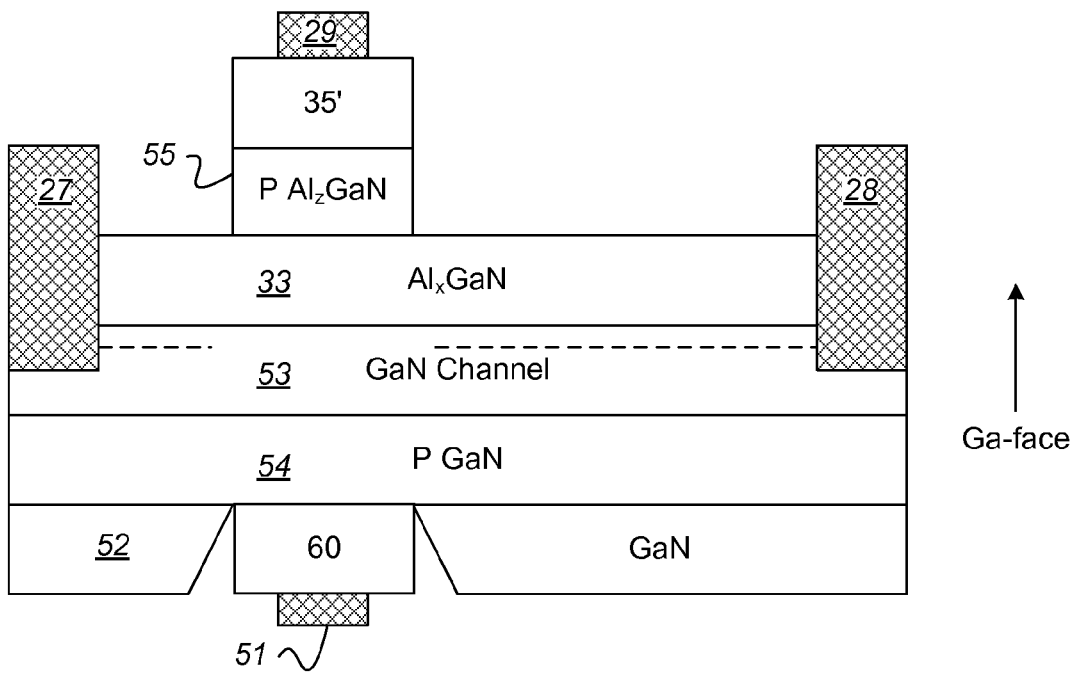
FIG. _22
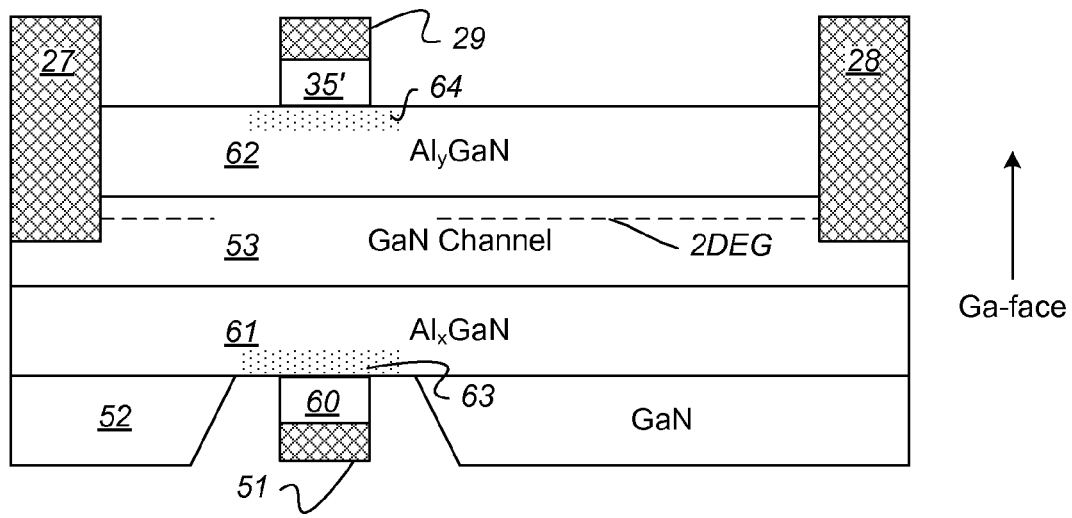
FIG. _23

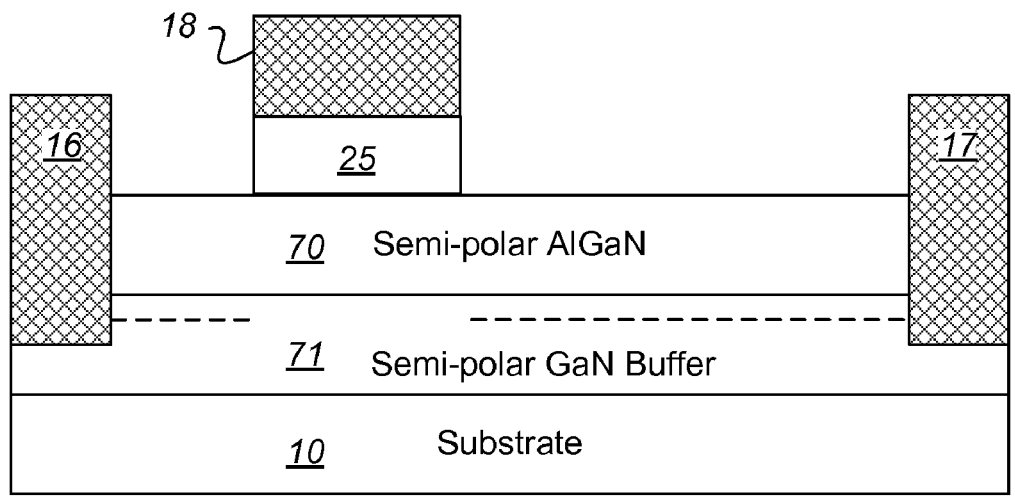
FIG._24
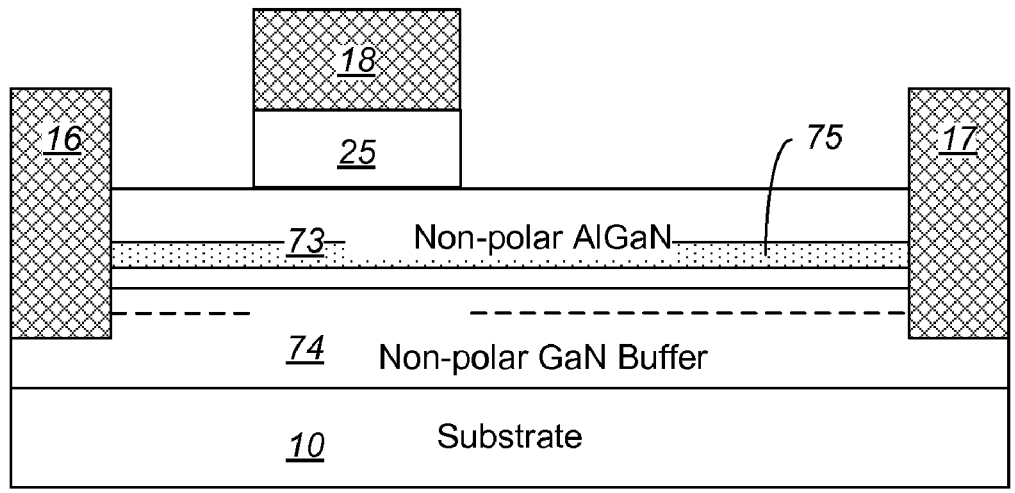
FIG._25

INSULATED GATE E-MODE TRANSISTORS

CROSS-REFERENCE TO RELATED APPLICATIONS

This application claims priority to U.S. Provisional Application Ser. No. 61/012,755, filed on Dec. 10, 2007, which is in incorporated herein for all purposes.

BACKGROUND

This invention relates to transistors, and more particularly to III-nitride type transistors.

Gallium nitride (GaN) semiconductor devices, which are III-V or III-nitride type devices, are emerging as an attractive candidate for power semiconductor devices because the GaN devices are capable of carrying large currents and supporting high voltages. Such devices are also able to provide very low on-resistance and fast switching times. A high electron mobility transistor (HEMT) is one type power semiconductor device that can be fabricated based on GaN materials. As used herein, GaN materials that are suitable for transistors can include binary, tertiary, or quaternary materials, which are based on varying the relative amounts of group III elements Al, In, and Ga, in $Al_xIn_yGa_{1-x-y}N$, such that $0 \leq x \leq 1$, $0 \leq y \leq 1$, and $0 \leq 1-x-y \leq 1$. Further, GaN materials can include various polarities of AlInGaN, such as Ga-polar, N-polar, semi-polar or non-polar.

Referring to FIG. 1, a field effect transistor (FET), e.g., a GaN HEMT device, can include a III-nitride semiconductor body with at least two III-nitride layers formed thereon. The material which forms III-nitride layer 12, which for example may be AlGaN, has a larger bandgap than that which forms buffer layer 11, which may be GaN. The polarization field that results from the different materials in the adjacent III-nitride layers induces a conductive two dimensional electron gas (2DEG) region near the junction 9 of the two layers, specifically in the layer with the narrower band gap. The 2DEG region is shown throughout the figures as a dashed line. One of the layers through which current is conducted is the channel layer. Herein, the narrower band gap layer in which the current carrying channel, or the 2DEG is located is referred to as the channel layer. The device also includes a schottky gate electrode 18 and ohmic source and drain electrodes 16, 17 on either side of the gate electrode 18. The region between the gate and drain and the gate and source, which allows for current to be conducted through the device, is the access region 7. The region below the gate electrode 18 is the gate region 6.

FIG. 1 shows a typical standard AlGaN/GaN HEMT structure, which could be designed to have a threshold voltage of −3V. Layer 10 is a substrate, such as of SiC, sapphire, Si, or GaN, layer 11 is a GaN buffer, and layer 12 is AlGaN, with 20% Al composition as an example ($Al_{0.2}Ga_{0.8}N$). Layers 11 and 12 are both Ga-face material. The dashed line represents the two-dimensional electron gas (2DEG) present in this structure. A negative gate voltage is required to deplete the 2DEG under the gate and thereby turn the device off.

The gate electrode 18 modulates the 2DEG underneath the gate contact. Standard AlGaN/GaN HEMTs, such as the one shown in FIG. 1, and related devices are typically normally on (i.e., depletion mode devices), and therefore can conduct current at 0 gate voltage. A depletion mode device requires a conducting channel in both the gate region and access regions when 0V is applied to the gate. It can be desirable in power electronics to have normally off devices (i.e., enhancement mode devices) that do not conduct at 0 gate voltage to avoid damage to the devices or other circuit components by preventing any accidental turn on of the device.

SUMMARY

Enhancement-mode (e-mode) GaN-based HEMTs with large source to drain barrier in the off state, low off state leakage, and low channel resistance in the access regions are described. Devices described herein can include one or more of the following features. An e-mode device can include a charge depleting layer under the gate. An e-mode device can include a charge enhancing layer outside of the gate region, that is, in the access region. The charge depleting layer and/or the charge enhancing layer can be applied to one or both of the Ga-face or the N-face.

In one embodiment, a III-nitride HEMT device is described that has a gate electrode, a source electrode and a drain electrode, a series of III-nitride layers forming an N-face stack with an uppermost layer with which the source and drain electrodes form ohmic contacts and a channel depleting portion is between the gate electrode and the uppermost layer of the N-face stack. The channel depleting portion does not extend all the way to the source electrode.

In another embodiment, a III-nitride HEMT device is described. The device includes a gate electrode, a source electrode and a drain electrode, a series of III-nitride layers forming a Ga-face stack with an uppermost layer, and a channel layer with which the source and drain electrodes form ohmic contacts, a dielectric layer on the uppermost layer and over an access region of the device, a channel depleting portion between the gate and the uppermost layer of the N-face stack, and a charge enhancing III-nitride layer between the dielectric layer and the uppermost layer and surrounding the channel depleting portion. The channel depleting portion does not extend all the way to the source electrode.

In yet another embodiment, a III-nitride HEMT device is described. The device has a gate electrode, a source electrode and a drain electrode, a series of III-nitride layers forming a Ga-face stack with an uppermost layer and a channel layer with which the source and drain electrodes form ohmic contacts, a channel depleting portion between the gate electrode and the uppermost layer of the Ga-face stack, a charge enhancing III-nitride layer over the uppermost layer and surrounding the channel depleting portion and a GaN layer between the charge enhancing III-nitride layer and the uppermost layer. The channel depleting portion does not extend all the way to the source electrode.

In another embodiment, a normally off III-nitride HEMT device is described. The device has an upper gate electrode, a source electrode and a drain electrode, a series of III-nitride layers forming a Ga-face stack with an uppermost layer and a channel layer with which the source and drain electrodes form ohmic contacts, and a channel depleting portion either between the upper gate electrode and the uppermost layer of the Ga-face stack. The channel depleting portion does not extend all the way to the source electrode. The series of III-nitride layers includes a p-type III-nitride capping layer adjacent to a III-nitride type covering layer on an N-face of the series and an aperture in the covering layer exposes a portion of the p-type III-nitride capping layer In yet another embodiment, a III-nitride HEMT device is described. The device has a gate electrode, a source electrode and a drain electrode, a series of semi-polar or nonpolar III-nitride layers with an uppermost layer and a channel layer with which the source and drain electrodes form ohmic contacts and a channel depleting portion between the gate and the uppermost layer of the semi-polar or nonpolar stack, wherein the channel depleting portion does not extend all the way to the source electrode.

Embodiments of the device can include one or more of the following features. The uppermost layer can be a channel layer in which a 2DEG is formed in an access region of the device. A gate region of the channel layer may not contain a 2DEG in the absence of a voltage applied to the gate electrode, and the device can be an enhancement mode device. The uppermost layer can include a recess in a gate region and the channel depleting portion can be in the recess. A channel charge enhancing layer can be on the uppermost layer, contacting the channel depleting portion and extending toward the source electrode and the drain electrode. A field plate can extend toward the drain electrode. The channel depleting portion can extend partially toward the drain electrode. The channel charge enhancing layer can comprise SiN. A p-type III-nitride region can be between the channel depleting portion and the uppermost layer. The p-type III-nitride region can extend from the source electrode to the drain electrode, and the device can further include an additional GaN layer in an access region of the device adjacent to the p-type III-nitride on a side opposite the uppermost layer. The p-type III-nitride region can include AlGaN, wherein $0.05 \leq z \leq 0.35$. The channel depleting portion can include a high-K dielectric. The channel depleting portion can be formed of AlSiN, $Ta_2O_5$, $HfO_2$ or $ZrO_2$. The channel depleting portion can include a high-K dielectric. The channel depleting portion can be formed of AlSiN, $Ta_2O_5$, $HfO_2$ or $ZrO_2$. The channel depleting portion can extend part way toward the drain electrode, but does not contact the drain electrode. A field plate can extend towards the drain electrode. An interlayer of AlN can be between the uppermost layer and the channel layer. A GaN layer can be between the charge enhancing III-nitride layer and the uppermost layer. The uppermost layer can be a p-type layer. The uppermost layer can be doped n-type. A p-type III-nitride type cap portion can be between the uppermost layer and the upper gate electrode. A lower gate electrode can be in or adjacent to the aperture in the covering layer. A gate region of the uppermost layer can be treated with fluorine.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a schematic of a depletion mode III-nitride device.

FIG. 2a is a schematic of an enhancement mode III-nitride device with a channel-depleting dielectric in the gate region.

FIG. 2b is a schematic of an enhancement mode III-nitride device.

FIG. 2c is a schematic of an enhancement mode III-nitride device.

FIG. 3 is a schematic of an N-face enhancement mode III-nitride device with a channel-depleting dielectric in the gate region.

FIG. 4 is a schematic of an N-face enhancement mode III-nitride device with a channel-depleting dielectric in the gate region and in a recess.

FIGS. 5-6 are schematics of N-face enhancement mode III-nitride devices with a channel-depleting dielectric in the gate region and with a field plate.

FIG. 7 is a schematic of an N-face enhancement mode III-nitride device with a channel-depleting dielectric in the gate region and a cap.

FIG. 8 is a schematic of an N-face enhancement mode III-nitride device with a channel-depleting dielectric in the gate region, a field plate and a cap.

FIG. 9 is a schematic of an N-face enhancement mode III-nitride device with a channel-depleting dielectric in the gate region, which covers part of an insulator.

FIG. 10 is a schematic of a Ga-face enhancement mode III-nitride device with a channel-depleting dielectric in the gate region, a passivation layer and a field plate.

FIG. 11 is a schematic of a Ga-face enhancement mode III-nitride device with a channel-depleting dielectric in the gate region and a passivation layer.

FIG. 12 is a schematic of a Ga-face enhancement mode III-nitride device with a channel-depleting dielectric in the gate region, a passivation layer and a field plate.

FIG. 13 is a schematic of a Ga-face enhancement mode III-nitride device with a channel-depleting dielectric in the gate region and an interlayer.

FIG. 14 is a schematic of a Ga-face enhancement mode III-nitride device with a channel-depleting dielectric in the gate region and an interlayer.

FIG. 15 is a schematic of a Ga-face enhancement mode III-nitride device with a channel-depleting dielectric in the gate region and an interlayer.

FIG. 16 is a schematic of a Ga-face enhancement mode III-nitride device with a channel-depleting dielectric in the gate region, a passivation layer and multiple layers of III-nitride materials.

FIG. 17 is a schematic of a Ga-face enhancement mode III-nitride device with a channel-depleting dielectric in the gate region and multiple layers of III-nitride materials.

FIG. 18 is a schematic of a Ga-face enhancement mode III-nitride device with a channel-depleting dielectric in the gate region, a passivation layer and multiple layers of III-nitride materials.

FIG. 19 is a schematic of a Ga-face enhancement mode III-nitride device with a channel-depleting dielectric in the gate region, a passivation layer, multiple layers of III-nitride materials and a field plate.

FIG. 20 is a schematic of a Ga-face enhancement mode III-nitride device with a channel-depleting dielectric in the gate region and an interlayer.

FIG. 21 is a schematic of a Ga-face enhancement mode III-nitride device with a channel-depleting dielectric in the gate region, a passivation layer and a p-type cap.

FIG. 22 is a schematic of a Ga-face enhancement mode III-nitride device with a channel-depleting dielectric in the gate region and gating on both sides of the device.

FIG. 23 is a schematic of a Ga-face enhancement mode III-nitride device with a channel-depleting dielectric in the gate region and gating on both sides of the device with fluorine treatment in the gating regions.

FIG. 24 is a schematic of an enhancement mode III-nitride device with semi-polar layers.

FIG. 25 is a schematic of an enhancement mode III-nitride device with non-polar layers.

Like reference symbols in the various drawings indicate like elements.

DETAILED DESCRIPTION

Structures and methods of achieving normally off gallium nitride transistor devices based on negative charge contributing channel-depleting gate dielectrics and methods of modifying the access region conductivity by surface layers or surface treatments are described. That is, a channel-depleting material or region is at least in the gate region and a channel charge enhancing layer or region is in the access region. The channel-depleting dielectric can have a negative charge and deplete negative charge from the channel. The normally off devices so achieved exhibit a high positive threshold voltage (such as 2-3 volts), a high internal barrier from source to drain at 0 bias (such as 0.5-2 eV) and a high access region conductivity (such as sheet resistance <750 ohms/square) along with high breakdown voltage (600/1200 Volts) and low on resistance (<5 or <10 mohm-cm$^2$ for 600/1200 V respectively). Examples are shown here for specific N-polar, Ga-polar, semi-polar and non-polar structures. However the general methodology may be applied to all structures based on Ga-polar, Ga-face, N-polar, N-face, semi-polar or non-polar GaN crystal orientations.

While it is impossible to make an enhancement mode device by inserting a standard dielectric under the gate of an AlGaN/GaN device that would otherwise be a depletion mode device, it is possible to make an enhancement mode device by inserting a channel-depleting dielectric under the gate of a standard AlGaN/GaN device that would otherwise be a depletion mode device, as shown in FIG. 2a. A channel-depleting dielectric, such as layer 13 in FIG. 2a, is one that reduces the amount of negative charge in the channel layer directly below it, for example because the dielectric contains negative charge, or it induces negative charge at the interface between the dielectric and the underlying layer, or through some other mechanism. Examples of insulators that can act as charge-depleting dielectrics when applied to GaN transistors include but are not limited to HfO$_2$, Ta$_2$O$_5$, ZrO$_2$, and AlSiN. With the design of a device as shown in FIG. 1, it is very difficult to obtain a positive threshold voltage. However, as shown in FIG. 2a, if a channel-depleting dielectric layer 13 is inserted under gate electrode 18, the 2DEG under the gate may be completely depleted at zero gate bias, and so a positive gate voltage is required to turn the device on, while the 2DEG channel in the access regions is unaffected. The gate region 6 and access region 7 are indicated in FIG. 2a. Although these regions are not indicated in the following figures for the sake of simplicity of the figures, they are located in the same location in each of the devices.

Referring to FIG. 2b and FIG. 2c, in enhancement mode devices, the requirements for the gate and access regions are different from in a depletion mode device. The devices include a substrate 20', on which a GaN buffer layer 21' and an AlGaN layer 12' are located. The AlGaN layer 12' includes a recess in the gate region 6. The gate region 6 is depleted when 0 gate voltage is applied. Preferably, the threshold voltage should be as high positive as possible (e.g., about 3 Volts is desirable), and the source to drain barrier when the device is in the off state should be as high as possible to ensure low source-drain leakage. A suitable band diagram for a barrier can be found in U.S. application Ser. No. 11/856,687, filed Sep. 17, 2007. The access regions 7 need to be as conductive as possible, which is accomplished by ensuring a high channel charge in these regions at all times. It is generally difficult to achieve transistors that simultaneously maintains a high conductivity in the access region and do not conduct current at 0V gate bias.

While it is possible to make standard AlGaN/GaN devices with a threshold voltage greater than 0, for example by including a recess under the gate, it is very difficult to simultaneously ensure a high barrier from source to drain in the off state. Referring to FIG. 2c, by utilizing a standard insulator 14, e.g., a dielectric, under the gate and in the gate region, the threshold voltage of an enhancement mode device can always be shifted more positive, but the device will still have the same low barrier from the source to drain at 0V gate bias. While inserting a standard insulator under the gate may cause a positive shift in the threshold voltage of both depletion and enhancement mode devices, an enhancement-mode device cannot be achieved by inserting a standard dielectric underneath the gate of a device that would otherwise be a depletion-mode device.

Enhancement-mode GaN-based HEMTs with large source to drain barrier in the off state, low off state leakage, and low channel resistance in the access regions are described. In some embodiments, Ga-face III-nitride material layers are used, and in other embodiments N-face III-nitride material layers are used. Enhancement-mode devices can be achieved using one or more of the following techniques. One technique is simultaneous and independent use of a channel charge depleting treatment/layer in the gate region and a channel charge enhancing treatment/layer in the access region of the transistor. The channel charge enhancing treatment can be a passivation layer (such as SiN) or a separate treatment (such as diffusion or implantation) followed by a suitable passivation layer. The access region channel charge enhancing layer, if SiN, can be deposited by techniques that result in SiN on GaN or AlGaN with the desired properties of inducing channel charge. Some techniques include but are not limited to plasma enhanced chemical vapor deposition (PECVD), catalytic chemical vapor deposition (CATCVD), metal oxide chemical vapor deposition (MOCVD), and sputter deposition. Alternatively, methods such as ion implantation or dopant diffusion may be used for the channel charge enhancing layer. The channel-depleting layer may be a high permittivity (high-K) dielectric, such as HfO$_2$, Ta$_2$O$_5$, or ZrO$_2$. This is advantageous in that it increases the gate capacitance, and thereby the device transconductance, as compared to a structure in which a lower permittivity dielectric is used. A number of deposition methods may be used to deposit these gate dielectric films, including but not limited to molecular beam epitaxy (MBE), metal-organic molecular beam epitaxy (MO-MBE), chemical vapor deposition (CVD), atomic layer deposition (ALD), pulsed laser deposition, sputter deposition, and evaporation. Ta$_2$O$_5$ is especially attractive as a gate dielectric material because its thermal expansion coefficient is similar to that of SiN. Since devices are typically covered with SiN during packaging, the use of a Ta$_2$O$_5$ may reduce strain in some of the device layers.

N-Faced Devices

Referring to FIG. 3, an enhancement mode device includes a substrate 20 on which a series of III-nitride type layers are formed. The substrate 20 can be formed of a suitable material, such as GaN, AlN, SiC, Si, sapphire, or another material on which an N-face III-nitride material can be grown. Alternatively, substrate 20 can be a carrier wafer, which is bonded to the overlying layers, which is described further below. A GaN buffer layer 21 is formed on the substrate 20. An AlGaN layer 22 is formed on the GaN buffer layer 21. A GaN layer 23 is formed on the AlGaN layer 22. Each of the layers 21, 22, 23 have an N-face furthest from the substrate 20. AlGaN layer 22 can be formed of Al$_x$In$_y$Ga$_{1-x-y}$N, where x and y are chosen such that a 2DEG is formed in the channel portion of the access regions. It is understood that basic variations of this epistructure in FIG. 3 can be made, such as adding another AlGaN layer on top of GaN layer 23 only in the region underneath the gate to further aid in depleting charge under the gate.

On GaN layer 23 is formed a source electrode 27 and a drain electrode 28 that are ohmic-type contacts. In the gate region, between the source and drain, is formed a channel-depleting dielectric region 25, on top of which is formed a gate electrode 29. The thickness and compositions of layers 22 and 23 are chosen such that a 2DEG exists in the access regions. In the gate region, dielectric region 25 causes the channel to be depleted of charge at 0 gate voltage, breaking the 2DEG. Thus, a positive gate voltage must be applied to turn the device on. Dielectric region 25 can include or consist of any dielectric material which causes a positive shift in the device threshold voltage and simultaneously increases the barrier from source to drain when the device is in the off state, for example AlSiN. In some embodiments, dielectric region 25 is a high-K dielectric, such as $HfO_2$, $Ta_2O_5$, or $ZrO_2$. High-K dielectrics ensure high transconductance, that is, gain, of the transistor. High-k dielectrics can be dielectric materials with a dielectric constant greater than the dielectric constant of silicon dioxide, such as k>4, but typically have a dielectric constant k>15.

Referring to FIG. 4, enhancement mode devices similar to the device shown in FIG. 3 include a body with the substrate 20, GaN buffer layer 21 and AlGaN layer 22. However, GaN layer 23' differs in that the layer includes a recess under the gate. The recess allows the dielectric region 25 to be closer to the AlGaN layer 22. The recess increases the threshold voltage of the device, as well as increases the barrier from the source to the drain when the device is in the off state.

Referring to FIGS. 5 and 6, an enhancement mode device similar to the device shown in FIG. 4 includes a body with the substrate 20, GaN buffer layer 21, AlGaN layer 22 and recessed GaN layer 23'. The two devices further include a dielectric layer 24, which is on a side of the GaN layer 23' opposite to the AlGaN layer 22. The dielectric layer 24, which can be SiN, increases the 2DEG charge density in the access regions, thus reducing the access resistance. Dielectric layer 24 may also act as a passivation layer. In some embodiments, a specific treatment (such as diffusion, implantation or other charge inducing surface layer) is applied to recessed GaN layer 23' outside the gate region and in the access region, before the deposition of the dielectric layer 24.

A field plate is included (shown as part of the gate 29') to increase the device breakdown voltage and improve performance. Two different field plate configurations are shown, one in FIG. 5 and one in FIG. 6. FIG. 5 shows a field plate configuration where the extension of the gate electrode 29' over the dielectric layer 24 on top of the access region and towards drain electrode 28 causes a reduction in the peak electric field in the device. FIG. 6 shows a field plate, which is formed by extending the channel-depleting gate dielectric region 25' over dielectric layer 24 towards the drain electrode 28, and extending the gate electrode 29' over dielectric region 25' towards the drain electrode 28. The extensions of dielectric region 25' and gate electrode 29' form a field plate, and each acts to reduce the peak field in the device. In FIG. 6, gate electrode 29' extends farther towards the drain electrode 28 than does dielectric region 25'. Thus, a section of gate electrode 29' is directly on dielectric layer 24. However, in some embodiments dielectric region 25' extends farther towards the drain electrode 28 than gate electrode 29', such that gate electrode 29' lies entirely on top of dielectric region 25'. In other embodiments, dielectric layer 25' extends towards the drain but gate electrode 29' does not, thus the field plate is formed only by the extension of layer 25'. Other field plate configurations for either the device in FIG. 5 or FIG. 6 include multiple metal layers each separated by an insulator, some or all of which may be connected to either the gate metal or source metal.

Referring to FIGS. 7 and 8, enhancement mode devices similar to those shown in FIGS. 3 and 6 are shown. The devices include a p-type $Al_zGaN$ region 26 between GaN layer 23 and dielectric region 25, wherein z is between 0 and 1, such as 0.05<z<0.35, such as z is about 0.2 or 0.25. The p-type $Al_zGaN$ region 26 further increases the threshold voltage as well as increases the barrier from source to drain when the device is in the off state. In some embodiments, the AlGaN layer 22 is ion implanted in the access region with n-type dopant ions, such as silicon. As noted herein, ion implantation can be performed with any of the devices described herein. Referring to FIG. 9, an enhancement mode device includes a stack on the substrate 20 of the GaN buffer 21, AlGaN layer 22 and GaN layer 23. On the GaN layer 23 is a p-type $Al_zGaN$ layer 26' that extends between the source 27 and the drain electrode 28. A channel depleting dielectric region 25 is in the gate region on the p-type $Al_zGaN$ layer 26'. On either side of the channel depleting dielectric region 25, i.e., above the access region, is a GaN layer 50. In the gate region, the p-type $Al_zGaN$ layer 26' further increases the threshold voltage as well as increases the barrier from source to drain when the device is in the off state. In the access regions, layer 26' reduces the charge in the 2DEG. The reduction in access region charge is counteracted by GaN layer 50, which increases the 2DEG in the access region.

Ga-Faced Devices

Referring to FIGS. 10-13, Ga-face III-nitride devices are shown. Each device has a gate recess. Referring to FIG. 10, the substrate 20' is a substrate on which Ga-face III-nitride layers can be formed, such as GaN, AlN, SiC, Si or sapphire. On the substrate 20' and GaN buffer layer 21' is formed an $Al_xGaN$ layer 33. On the $Al_xGaN$ layer 33 in the access regions is an $Al_yGaN$ layer 36 and a dielectric layer 34. The aluminum compositions x and y in layers 33 and 36 and the thickness of the layers are selected so that a net polarization forms a 2DEG in the channel portion of the access regions, where x=y, x<y or x>y. Alternatively, $Al_xGaN$ layer 33 consists of $Al_xIn_zGa_{1-x-z}N$, and layer 36 consists of $Al_yIn_wGa_{1-y-w}N$, where x, z, y and w as well as the thickness of the layers are chosen so that a 2DEG is formed in the channel portion of the access regions.

Dielectric layer 34 acts as a passivation layer and can increase the 2DEG charge density in the access regions, thus reducing the access resistance. A suitable material for dielectric layer 34 is SiN. In some embodiments, a dopant diffusion layer placed at the location where layer 34 is found is included in the device at an intermediate stage of processing to induce charge, and is removed before completion of the device.

On top of the $Al_xGaN$ layer 33 is a dielectric region 35, which is at least in the gate region. In the device shown in FIG. 10, parts of dielectric region 35 extend over dielectric layer 34 and in part of the access region. Dielectric region 35 is formed of a material that causes a positive shift in the device threshold voltage and simultaneously increases the barrier from source to drain when the device is in the off state, i.e., a channel depleting dielectric, such as $Ta_2O_5$, $HfO_2$, AlSiN, or $ZrO_2$. In some embodiments, dielectric region 35 is a high-K dielectric. In some embodiments, such as shown in FIG. 11, the dielectric region 35' covers the entire gate region, but no part of the access region or the dielectric layer 34. In other embodiments, such as shown in FIGS. 10, 12 and 13, the dielectric region 35 or 35" also extends part way to the source and drain. And in yet other embodiments, the dielectric region extends all the way to the source and the drain (not shown).

Referring to FIG. 12, the dielectric region 35" can form part of a field plate. The field plate can increase the device breakdown voltage and improves the device performance. The field plate can also include a combination of metal layers, some or all of which can be externally connected to the source or gate, and a dielectric layer, which is an extension of dielectric region 35".

Referring to FIG. 13, the gate electrode 29 does not extend beyond the gate region. However, the dielectric region 35 extends laterally over passivation layer 34 beyond the gate region and towards both the source and the drain, just towards the source, or just towards the drain, but not all the way to the source and/or the drain.

Referring to FIGS. 14-15, similar to the devices shown in FIGS. 10-12, Ga-face III-nitride devices are shown. However, an AlN layer 32, i.e., an AlN interlayer, is between GaN buffer layer 21' and $Al_xGaN$ layer 33. The AlN layer 32 is thin, such as between about 0.2 and 0.7 nm, such as about 0.5 nm in thickness. The AlN layer 32 increases the maximum device current and decreases the access resistance. The combination of a gate recess and a channel depleting dielectric material under the gate causes a positive shift in the device threshold voltage and simultaneously increases the barrier from the source to the drain. This results in a sufficiently large positive shift in the threshold voltage to enable an enhancement mode device with an AlN interlayer.

Referring to FIGS. 16-19, similar to the devices shown in FIGS. 10-12, Ga-face III-nitride devices are shown. Although similar to FIG. 11, the devices in FIGS. 16 and 17 have a GaN layer 40 in between $Al_xGaN$ layer 33 and $Al_yGaN$ layer 36. The device in FIG. 17 is the same as the device shown in FIG. 16, except that the device lacks a surface passivation layer or dielectric layer 34 that the device in FIG. 11 has. FIG. 18 shows a dielectric region 35 that extends partially over dielectric layer 34 toward the source and the drain electrodes 27, 28. In some embodiments, the dielectric region 35 extends the entire way from the gate region to the source and the drain.

Because the GaN layer 40 in the devices shown in FIGS. 16-18 and the underlying $Al_xGaN$ layer 33 have different etching characteristics, the $Al_xGaN$ layer 33 can be used as an etch stop. This enables a precise etching depth. Thus, dielectric region 35 is on a top surface of $Al_xGaN$ layer 33 and has a bottom surface that is flush with the bottom surface of GaN layer 40. Referring to FIG. 19, the dielectric region 35" and gate electrode 29" can form a field plate. The dielectric region 35" extends partially over the dielectric layer 34 toward drain electrode 28 and the gate electrode 29" extends entirely over the dielectric region 35" and partially over the dielectric layer 34 toward drain electrode 28 and beyond an edge of dielectric region 35".

Referring to FIG. 20, an enhancement mode device similar to the device shown in FIG. 16 is shown. However, an AlN layer 32 is between the GaN buffer 21 and the $Al_xGaN$ layer 33. The AlN layer 32 increases the maximum device current and decreases the access resistance. The combination of a gate recess and a channel depleting dielectric under the gate causes a positive shift in the device threshold voltage and simultaneously increases the barrier from source to drain results in a large enough positive shift in the threshold voltage to enable enhancement mode devices with an AlN interlayer. The positive threshold shift caused by either one of these features individually may not be large enough to enable an enhancement mode device when the AlN layer 32 is used. As with other embodiments, dielectric region 35 may extend over dielectric layer 34 all the way or part way towards the source and drain electrodes. In some embodiments, this device is formed with a field plate (not shown).

Referring to FIG. 21, an enhancement mode device similar to the device shown in FIG. 20 is shown. However, $Al_xGaN$ layer 33 is replaced by p-type $Al_xGaN$ layer 41. As with other embodiments, dielectric region 35' may be limited in extent to within the gate region or can extend over dielectric layer 34 all the way or part way towards the source and drain electrodes. In some embodiments, this device is formed with a field plate. Replacing $Al_xGaN$ layer 33 with p-type $Al_xGaN$ layer 41 directly below the gate electrode 29 causes a positive shift in the threshold voltage as well as an increase in the source to drain barrier when the device is in the off state. In the access regions, the loss in channel charge associated with the insertion of p-type $Al_xGaN$ layer 41 can be mitigated by adjusting the thickness and Al composition of $Al_yGaN$ layer 36, so that the device threshold voltage is increased while simultaneously a small access resistance is maintained. In some structures, the p-type layer may be only under the gate.

Referring to FIG. 22, a Ga-face enhancement mode III-nitride device is formed as a lateral device having the channel-depleting dielectric region 35' under the gate electrode 29 and a channel-depleting dielectric region 60 in between secondary gate electrode 51 and p-type GaN layer 54. A secondary gate electrode 51 is also on the N-face of the device. The device includes a p-type AlGaN cap 55 on the Ga-face and a p-type $Al_yGaN$ cap layer (shown as p-type GaN layer 54) accessed from the N-face of the device, where $0 \leq y \leq 1$ and $0 \leq z \leq 1$. In some embodiments, either of the p-type $Al_zGaN$ cap 55 or the p-type $Al_xGaN$ layer 33 is a graded layer, that is, includes more or less aluminum at different depths of the layer. The device includes a GaN layer 52 on the N-face of the p-type GaN layer 54. The GaN layer 52 includes a recess which exposes the p-type GaN layer 54. A channel depleting dielectric region 60 is between the bottom gate electrode 51 and the p-type GaN layer 54.

On an opposite side of the p-type GaN layer 54 is a GaN channel layer 53. An $Al_xGaN$ layer 33 adjacent to the GaN channel layer 53 and opposite to the p-type GaN cap layer 54 contributes to the 2DEG in the GaN channel layer 53. The p-type $Al_zGaN$ cap 55 is on the layer of $Al_xGaN$ 33, in the gate region and under gate 29.

In some embodiments, the $Al_xGaN/GaN$ layers 33, 53 are grown thin enough so that the surface pinning position of the p-type $Al_zGaN$ or GaN layers 55, 54 depletes the 2DEG at the $A_xGaN/GaN$ layer interface in the gate region. For example, the $Al_xGaN/GaN$ layers 33, 54 are grown thin when the device includes a fully depleted p-type layer. If the device has a thick p-type layer on top, the barrier created by the p-type $Al_zGaN/Al_xGaN$ junction depletes the 2DEG. Depleting the 2DEG from both surfaces increases the internal barrier and the threshold voltage. The presence of high p-$Al_xGaN$ or GaN barriers also results in high gate turn-on voltage and reduction of gate leakage current. Additional insulating layers may be applied between the gates (29 or 51) and the respective p-type layers (55 and 54).

In some embodiments, one of gate electrodes 29, 51 is optional on the device. In some embodiments, either the dielectric region 35' or 60 is optional.

Without the p-type $Al_zGaN$ cap 55 and the channel-depleting dielectric 35', the polarization fields in the $Al_xGaN/GaN$ layers 33, 53 allows for the 2DEG at the $Al_xGaN/GaN$ interface in the access region. Thus, the thickness of the $Al_xGaN$ layer 33 is controlled to maintain adequate 2DEG and a low on-resistance. A similar device is described in U.S. application Ser. No. 11/856,687, filed Sep. 17, 2007, which is incorporated herein by reference for all purposes.

In an alternative embodiment of the device shown in FIG. 22, an Al$_y$GaN layer is formed on Al$_x$GaN layer 33 and surrounding p-type Al$_z$GaN cap 55.

Referring to FIG. 23, another embodiment of an enhancement mode III-nitride device with gating on both the Ga and N-faces is shown where the device is fluorine treated. The device includes a region on both the Ga-face beneath the gate and a region on an N-face beneath the gate (or above a lower gate electrode 51 when viewed as in FIG. 23) that has been treated with a fluorine compound. The fluorine treatment can be a fluorine based plasma treatment. A fluorine treatment on both the Ga-face and the N-face increases the internal barrier and the threshold voltage of the device.

The structure under the upper gate 29 is a layer of Al$_y$GaN 62 on a GaN channel layer 53 on a layer of Al$_x$GaN 61, which is on a GaN layer 52. A recess in the GaN layer 52 exposes a portion of the layer of Al$_x$GaN 61. The recess is below the gate electrode 29 and not below the access region. The exposed portion 63 of the layer of Al$_x$GaN 61 is treated with a plasma of a fluorine compound. Similarly, a gate region 64 of the layer of Al$_y$GaN 62 is treated with the plasma. The fluorine-based treatment is not applied to the access regions.

In some embodiments, a bottom gate 51 is formed in the recess after the fluorine treatment of the N-face. In some embodiments, one of the gate electrodes 29, 51 and/or one of the insulating layers 35', 60 is optional. A similar device is described in U.S. application Ser. No. 11/856,687, filed Sep. 17, 2007.

Non-Polar and Semi-Polar Devices

Referring to FIGS. 24 and 25, an enhancement mode device includes a substrate 10 on which a series of non-polar 73, 74 or semi-polar 70, 71 III-nitride type layers are formed. The substrate 10 can be formed of a suitable material, such as GaN, AlN, SiC, Si, sapphire, or another material on which non-polar or semi-polar nitride material can be grown. A semi-polar or non-polar GaN buffer layer 71, 74 is formed on the substrate 10. A semi-polar or non-polar AlGaN layer 70, 73 is formed on the GaN buffer layer 71, 74. Ohmic source and drain contacts 16 and 17 are formed on either side. In the gate region on top of AlGaN layer 70, 73 is formed channel-depleting dielectric layer 25, on top of which is formed gate electrode 18. In the non-polar device, a subportion 75 of AlGaN layer 73 is doped n-type in order to induce charge in the access regions of the device.

Depletion-Mode Devices

While the devices that have been described herein are enhancement mode III-nitride devices with channel depleting dielectrics, depletion mode III-nitride devices with channel depleting dielectrics can be designed also. In one embodiment, the device in FIG. 3 is designed such that the 2DEG channel extends all the way from the source 27 to the drain 28 at 0 gate voltage, for example by ensuring that Al$_x$Ga$_{1-x}$N layer 22 has a large enough Al concentration, such as x≧0.2. In this embodiment, the charge concentration in the portion of the 2DEG underneath the gate electrode is less than that in the access regions. This embodiment may exhibit better linearity as compared to a depletion mode device without a channel depleting portion underneath the gate. Similarly, the devices illustrated in FIGS. 4-9 can all be designed such that they contain a 2DEG channel that extends all the way from the source 27 to the drain 28 at 0 gate voltage, such as by ensuring that Al$_x$Ga$_{1-x}$N layer 22 has a large enough Al concentration, such as x>0.2. In other embodiments, the devices in FIGS. 10-20 are all designed such that they contain a 2DEG channel that extends all the way from the source 27 to the drain 28 at 0 gate voltage, such as by ensuring that Al$_x$Ga$_{1-x}$N layer 33 has a large enough Al concentration, such as x>0.2.

Several embodiments of enhancement mode III-nitride type devices are described. Typical material growth methods for the various types of GaN devices include but are not limited to molecular beam epitaxy, metal-organic molecular beam epitaxy, chemical vapor deposition, atomic layer deposition, pulsed laser deposition, sputter deposition, and evaporation. In addition, methods for forming N-face devices are described further in U.S. application Ser. No. 11/856,687, filed Sep. 17, 2007. Such a method can include forming a Ga-face assembly of III-nitride layers. A carrier wafer, or substrate, is bonded onto a top of the assembly, such as by using a metal based bond or a dielectric bond or other suitable bond. If the carrier wafer will eventually serve as the final substrate, the carrier wafer can be thermally conducting and electrically insulating. In some embodiments, the bond between the carrier wafer and the top III-nitride layer is not conductive. The assembly with the carrier layer is then flipped over so that the carrier wafer is on the bottom of the assembly and serves as the substrate. The top substrate is removed using a technique suitable for the substrate material, such as laser liftoff for sapphire substrates, lapping or plasma etching for SiC based substrates or wet or dry etching for silicon substrates. Additional layers of the III-nitride assembly can also be removed, as required. The structure is now an N-face structure that is ready for completing to form the N-face devices described herein.

Any of the devices described herein can be passivated with a suitable dielectric, such as SiN. Passivation with SiN or a suitable dielectric can be desirable to minimize the effect of trapped charge and ensure good device operation. Here, SiN or other suitable passivation may be used in N-face and Ga-face III-N transistors.

Field plating by single or multiple field plates can increase the breakdown voltage of the device and further minimize the impact of trapping by reducing the peak electric field near the gate. Various field plate geometries have been described here which can be used for obtaining high breakdown voltages. Additionally, slant field plates may be provided for maximizing the benefits. A channel-depleting dielectric layer, such as Ta$_2$O$_5$ or HfO$_2$, can also be used to shape the electric field profile in the high field region and thus serve the same purpose as a standard field plate. This layer may be composed of the same material used underneath the gate electrode in the embodiments.

N-face GaN is chemically more sensitive than Ga-face GaN. In some embodiments, a thin capping layer, such as SiN is used at the beginning of device formation to ensure stability of the N-face surface in N-face devices. The cap ensures that the surface is not exposed to elements that may damage the surface during fabrication except as desired. This protective layer can be made thicker and also serve as the passivation layer.

In the devices described here, the buffer and/or channel layer material consists of GaN. It is also possible to use Al$_w$GaN for these layers without deviating from the scope of this invention. The devices are still designed so that a 2DEG is present in the access regions, which can be accomplished by using an Al$_w$GaN buffer layer where the Al composition is small, such as z<0.05.

Gate dielectrics may be used in HEMTs to decrease gate leakage and increase the device breakdown voltage. Gate dielectrics can be useful in forming GaN-based enhancement-mode devices because they may cause a positive shift in the device threshold voltage. It is preferable to use a dielectric with a high dielectric constant, that is, a so-called high-k dielectric, such as $HfO_2$, $ZrO_2$, or $Ta_2O_5$, because for a given dielectric thickness dielectrics with higher dielectric constants result in a device with a larger gate capacitance and a correspondingly larger transconductance. Additionally, some gate dielectrics, such as $HfO_2$ and $Ta_2O_5$, have been shown to deplete charge from the channel, either because they contain negative charge or induce negative charge at the surface they share with the underlying material, which results in a positive shift in the threshold voltage of devices in which they are used. Other dielectrics may possess these characteristics as well and are referred to as "channel-depleting dielectrics". Unlike with standard dielectrics, by inserting a negatively charged channel-depleting dielectric under the gate of a standard AlGaN/GaN device which has a negative threshold voltage, it is possible to shift the threshold voltage to a positive value. Also unlike the case with standard dielectrics, shifting the threshold voltage to be more positive by inserting a channel-depleting dielectric results in an increase in the source to drain barrier when the device is in the off state.

A number of embodiments of the invention have been described. Nevertheless, it will be understood that various modifications may be made without departing from the spirit and scope of the invention. For example, in some embodiments, the Ga-face is a Ga-polar face. Accordingly, other embodiments are within the scope of the following claims.

What is claimed is:

1. A III-nitride HEMT device, comprising:
    a gate electrode;
    a source electrode and a drain electrode;
    a series of III-nitride layers forming an N-face stack with an uppermost layer with which the source and drain electrodes form ohmic contacts; and
    a channel depleting portion between the gate electrode and the uppermost layer of the N-face stack, wherein the channel depleting portion does not extend all the way to the source electrode.

2. The device of claim 1, wherein the uppermost layer is a channel layer in which a 2DEG is formed in an access region of the device.

3. The device of claim 2, wherein a gate region of the channel layer does not contain a 2DEG in the absence of a voltage applied to the gate electrode, and the device is an enhancement mode device.

4. The device of claim 1, wherein the uppermost layer includes a recess in a gate region and the channel depleting portion is in the recess.

5. The device of claim 1, further comprising a channel charge enhancing layer on the uppermost layer, contacting the channel depleting portion and extending toward the source electrode and the drain electrode.

6. The device of claim 5, further comprising a field plate extending toward the drain electrode.

7. The device of claim 6, wherein the channel depleting portion extends partially toward the drain electrode.

8. The device of claim 5, wherein the channel charge enhancing layer comprises SiN.

9. The device of claim 1, further comprising a p-type III-nitride region between the channel depleting portion and the uppermost layer of the N-face stack.

10. The device of claim 9, wherein the p-type III-nitride region extends from the source electrode to the drain electrode, and the device further includes an additional GaN layer in an access region of the device adjacent to the p-type III-nitride on a side opposite the uppermost layer.

11. The device of claim 9, wherein the p-type III-nitride region includes $Al_zGaN$, wherein $0.05 \leq z \leq 0.35$.

12. The device of claim 1, wherein the channel depleting portion includes a high-K dielectric.

13. The device of claim 1, wherein the channel depleting portion is formed of AlSiN, $Ta_2O_5$, $HfO_2$ or $ZrO_2$.

14. A III-nitride HEMT device, comprising:
    a gate electrode;
    a source electrode and a drain electrode;
    a series of III-nitride layers forming a Ga-face stack with an uppermost layer, and a channel layer with which the source and drain electrodes form ohmic contacts;
    a dielectric layer on the uppermost layer and over an access region of the device;
    a channel depleting portion between the gate electrode and the uppermost layer of the Ga-face stack, wherein the channel depleting portion does not extend all the way to the source electrode; and
    a charge enhancing III-nitride layer between the dielectric layer and the uppermost layer and surrounding the channel depleting portion.

15. The device of claim 14, wherein a 2DEG is formed in an access region of the channel layer of the device.

16. The device of claim 15, wherein a gate region of the channel layer does not contain a 2DEG in an absence of a voltage applied to the gate electrode, and the device is an enhancement mode device.

17. The device of claim 14, wherein the channel depleting portion includes a high-K dielectric.

18. The device of claim 14, wherein the channel depleting portion is formed of AlSiN, $Ta_2O_5$, $HfO_2$ or $ZrO_2$.

19. The device of claim 14, wherein the channel depleting portion extends part way toward the drain electrode, but does not contact the drain electrode.

20. The device of claim 19, further comprising a field plate extending towards the drain electrode.

21. The device of claim 14, further comprising an interlayer of AlN between the uppermost layer and the channel layer.

22. The device of claim 14, further comprising a GaN layer between the charge enhancing III-nitride layer and the uppermost layer of the Ga-face stack.

23. The device of claim 21, wherein the uppermost layer is a p-type layer.

24. The device of claim 14, further comprising a field plate.

25. A III-nitride HEMT device, comprising:
    a gate electrode;
    a source electrode and a drain electrode;
    a series of III-nitride layers forming a Ga-face stack with an uppermost layer and a channel layer with which the source and drain electrodes form ohmic contacts;
    a channel depleting portion between the gate electrode and the uppermost layer of the Ga-face stack, wherein the channel depleting portion does not extend all the way to the source electrode;
    a charge enhancing III-nitride layer over the uppermost layer of the Ga-face stack and surrounding the channel depleting portion; and
    a GaN layer between the charge enhancing III-nitride layer and the uppermost layer of the Ga-face stack.

26. The device of claim 25, wherein a gate region of the channel layer does not contain a 2DEG in an absence of a voltage applied to the gate electrode, and the device is an enhancement mode device.

27. A normally off III-nitride HEMT device, comprising:
    an upper gate electrode;
    a source electrode and a drain electrode;
    a series of III-nitride layers forming a Ga-face stack with an uppermost layer and a channel layer with which the source and drain electrodes form ohmic contacts, wherein the series of III-nitride layers includes a p-type III-nitride capping layer adjacent to a III-nitride type covering layer on an N-face of the series and an aperture in the covering layer exposes a portion of the p-type III-nitride capping layer; and a channel depleting portion either between the upper gate electrode and the uppermost layer of the Ga-face stack, wherein the channel depleting portion does not extend all the way to the source electrode.

28. The device of claim 27, further comprising a p-type III-nitride type cap portion between the uppermost layer and the upper gate electrode.

29. The device of claim 27, further comprising a lower gate electrode in or adjacent to the aperture in the covering layer.

30. The device of claim 27, wherein a gate region of the uppermost layer is treated with fluorine.

31. A normally off III-nitride HEMT device, comprising:
an upper gate electrode;
a source electrode and a drain electrode; and
a series of III-nitride layers forming a Ga-face stack with an uppermost layer and a channel layer with which the source and drain electrodes form ohmic contacts, wherein the series of III-nitride layers includes a lower III-nitride layer adjacent to a III-nitride type covering layer on an N-face of the series and an aperture in the covering layer exposes a portion of the lower III-nitride layer; and a channel depleting portion either between the upper gate electrode and the uppermost layer of the Ga-face stack, wherein the channel depleting portion does not extend all the way to the source electrode;

wherein at least one of the uppermost layer in the gate region or the exposed portion of the lower III-nitride layer is treated with fluorine.

32. A normally off III-nitride HEMT device, comprising:
a gate electrode;
a source electrode and a drain electrode;
a series of semi-polar or nonpolar III-nitride layers with an uppermost layer, and a channel layer with which the source and drain electrodes form ohmic contacts; and
a channel depleting portion between the gate electrode and the uppermost layer of the N-face stack, wherein the channel depleting portion does not extend all the way to the source electrode.

33. The device of claim 32, wherein the uppermost layer is doped n-type.

* * * * *